United States Patent [19]

Momodomi et al.

[11] Patent Number: 5,268,867
[45] Date of Patent: Dec. 7, 1993

[54] SEMICONDUCTOR MEMORY DEVICE

[75] Inventors: Masaki Momodomi, Yokohama; Yasuo Itoh, Kawasaki; Yoshihisa Iwata; Tomoharu Tanaka, both of Yokohama; Yoshiyuki Tanaka, Tokyo, all of Japan

[73] Assignee: Kabushiki Kaisha Toshiba, Kanagawa, Japan

[21] Appl. No.: 957,001

[22] Filed: Oct. 6, 1992

[30] Foreign Application Priority Data

Oct. 7, 1991 [JP] Japan .................. 3-259470

[51] Int. Cl.[5] .............................................. G11C 7/00
[52] U.S. Cl. ..................... 365/203; 365/190
[58] Field of Search .............. 365/203, 190, 205, 207

[56] References Cited

U.S. PATENT DOCUMENTS

| | | | |
|---|---|---|---|
| 4,856,106 | 8/1989 | Teraoka | 365/203 |
| 4,903,238 | 2/1990 | Miyatake et al. | 365/190 X |
| 4,943,944 | 7/1990 | Sakui et al. | 365/203 X |
| 4,947,376 | 8/1990 | Arimoto et al. | 365/203 X |
| 4,982,367 | 1/1991 | Miyataka | 365/203 |
| 4,991,139 | 2/1991 | Takahashi et al. | 365/149 X |
| 5,001,668 | 3/1991 | Ito et al. | 365/203 X |
| 5,020,031 | 5/1991 | Miyatake | 365/205 X |
| 5,124,947 | 6/1992 | Nakada | 365/181.05 X |

FOREIGN PATENT DOCUMENTS

2-62785 3/1990 Japan .

Primary Examiner—Eugene R. LaRoche
Assistant Examiner—Do Hum Yoo
Attorney, Agent, or Firm—Banner, Birch, McKie & Beckett

[57] ABSTRACT

The present invention provides a semiconductor memory device capable of reducing its current consumption, controlling the generation of noise, and increasing in access using a precharge voltage applied to a precharge circuit. In the semiconductor memory device, a precharge circuit is connected to a pair of data input/output lines, and includes a MOS transistor connected between one of the data input/output lines and a node of a precharge voltage and a MOS transistor connected between the other data input/output line and a node of the precharge voltage. The gates of the MOS transistors are supplied with control signals so that the MOS transistors are turned on when the data input/output lines are precharged. A MOS transistor is connected to the data input/output lines for equalizing them. The precharge voltage is set to half of a value obtained by subtracting the threshold voltage of the MOS transistor from the power supply voltage.

2 Claims, 7 Drawing Sheets

SEMICONDUCTOR MEMORY DEVICE

BACKGROUND OF THE INVENTION

1. Field of the Invention

The present invention relates to a semiconductor memory device and, more particularly, to a semiconductor integrated circuit capable of reduction in current consumption, control of the generation of noise, and increase in access speed, using a precharge voltage applied to a precharge circuit.

2. Description of the Related Art

In a semiconductor memory device such as an EEPROM and a DRAM, data input/output lines or bit lines are precharged before data is read out from a memory cell. To set a potential of this precharge is very important for reading data at high speed and decreasing current consumption in the semiconductor memory device.

For example, a power precharge system is used for data I/O lines of a DRAM. In this power precharge system, a pair of data input/output lines IO and $\overline{IO}$ is precharged at a power supply voltage of 5 V before data is read out from a memory cell. When the data is read out, one of the data input/output lines is discharged from 5 V to 0 V, and a variation in potential of the discharged data input/output line is detected by a sense amplifier.

However, the conventional power precharge system has drawbacks in which current consumption is increased and noise is easy to generate. This is because a data input/output line generally has a relatively large capacitor, and this data input/output line has to be discharged at a full amplitude of the power supply voltage.

SUMMARY OF THE INVENTION

The object of the present invention is to provide a semiconductor integrated circuit capable of reduction in current consumption, control of the generation of noise, and increase in access speed.

A semiconductor integrated circuit according to the present invention comprises a pair of first and second signal lines, a pair of third and fourth signal lines connected to the first and second signal lines via transistors, respectively, a differential amplifier circuit supplied with signals from the third and fourth signals, and a precharge means for supplying to the third and fourth signal lines a precharge voltage which is half of a voltage obtained by subtracting a threshold voltage of the transistors from a power supply voltage.

Since the precharge voltage of the third and fourth signal lines is set to half of the voltage obtained by subtracting the threshold voltage from the power supply voltage, current consumption is decreased, noise is suppressed, and access speed can be increased. This is because one of the third and fourth signal lines can be charged at the precharge voltage and the other signal line can be discharged at 0 V, from the precharge voltage.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawing, which is incorporated in and constitutes a part of the specification, illustrates presently preferred embodiments of the invention and, together with the general description given above and the detailed description of the preferred embodiments given below, serves to explain the principles of the invention.

DETAILED DESCRIPTION OF THE PREFERRED EMBODIMENT

An embodiment of the present invention will now be described, with reference to the accompanying drawings.

Figure 1:
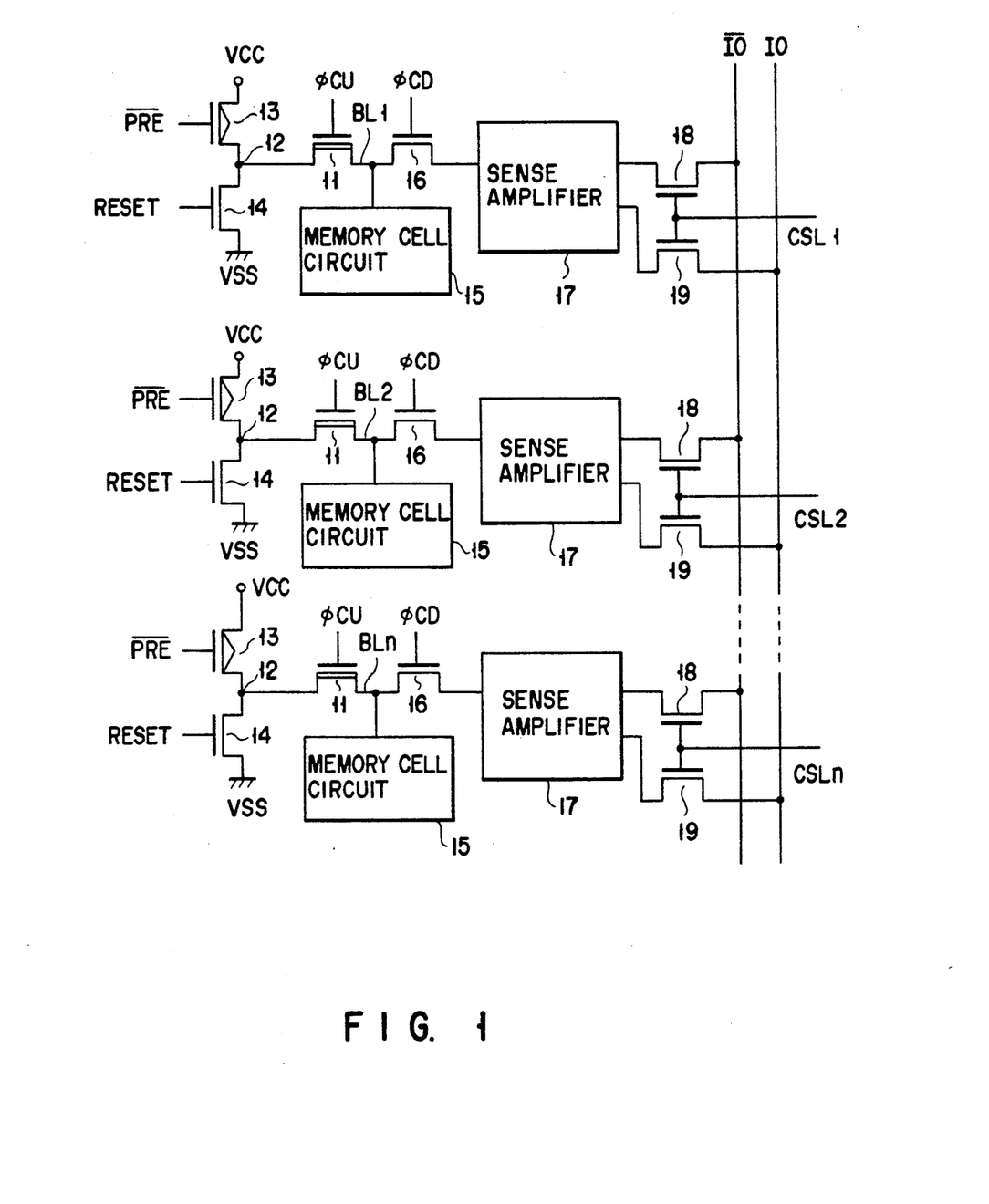
FIG. 1 is a circuit diagram of the overall constitution of a semiconductor integrated circuit according to an embodiment of the present invention.
Figure 2:
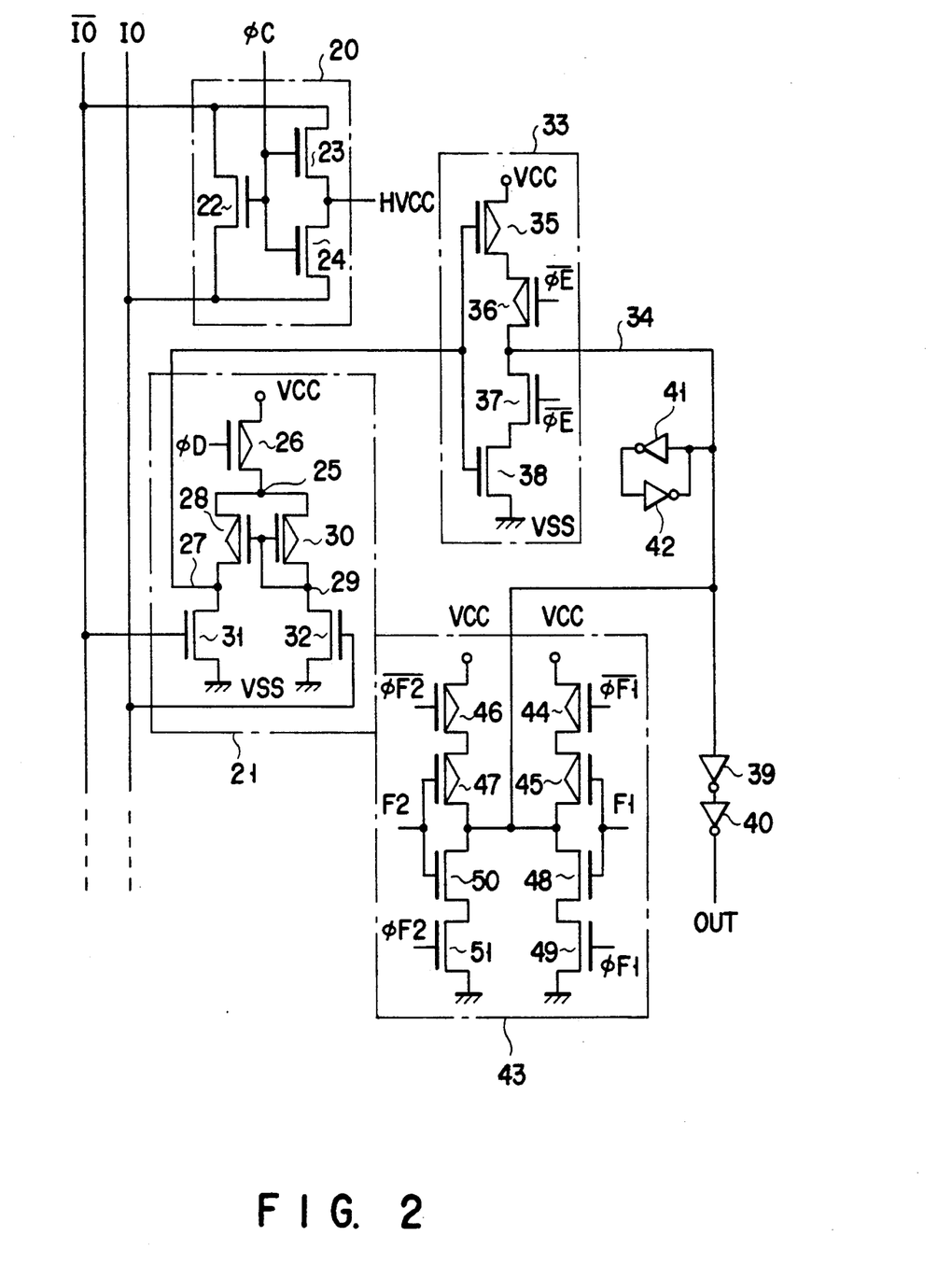
FIG. 2 is a circuit diagram of the overall constitution of the semiconductor integrated circuit according to the embodiment of the present invention.

FIGS. 1 and 2 show the overall constitution of a pair of data input/output lines of a semiconductor memory device having a NAND type EEPROM memory cell according to the embodiment of the present invention. Usually the number of pairs of data input/output lines is an eight multiple, such as 8, 16, 24, 32 pairs. The number is defined as n in this embodiment.

FIG. 1 shows bit lines BL1 to BLn. The bit line BL1 is connected to a node 12 via a depletion type MOS transistor 11 whose gate is supplied with a control signal φCU. A P-channel MOS transistor 13 whose gate is supplied with a precharge control signal $\overline{PRE}$ is connected between the node 12 and the node of power supply voltage VCC. Similarly, an N-channel MOS transistor 14 whose gate is supplied with a reset control signal RESET is connected between the node 12 and the node of ground voltage VSS.

The bit line BL1 is connected to a memory cell circuit 15, described later, and also connected to a sense amplifier 17 via an N-channel MOS transistor 16 whose gate is supplied with a control signal φCD. The sense amplifier 17 senses a signal voltage read out from the memory cell circuit 15 to the bit line BL1 and outputs complementary data. The complementary data is transmitted to data input/output lines $\overline{IO}$ and IO through column selection MOS transistors 18 and 19 whose gates are connected to a column selection line CSL1. Circuits including the other bit lines BL2 to BLn differ from the circuit including the bit line BL1 only in that the gates of column selection MOS transistors 18 and 19 are connected to column selection lines CSL2 to CSLn.

As shown in FIG. 2, a precharge circuit 20 and a differential amplifier circuit 21 are connected to the data input/output lines $\overline{IO}$ and IO. The precharge circuit 20 precharges the data input/output lines $\overline{IO}$ and IO at a predetermined voltage before data is read out from the memory cell 15, and has the following structure. In the precharge circuit 20, an N-channel MOS transistor 22 whose gate is supplied with a precharge control signal $\phi C$ is connected between the data input/output lines $\overline{IO}$ and IO, an N-channel MOS transistor 23 whose gate is supplied with the precharge control signal $\phi C$ is connected between the data input/output line $\overline{IO}$ and the node of precharge voltage HVCC, and an N-channel MOS transistor 24 whose gate is supplied with the precharge control signal $\phi C$ is connected between the data input/output line IO and the node of HVCC.

The differential amplifier circuit 21 amplifies a difference in potential between the data input/output lines $\overline{IO}$ and IO and outputs readout data, and has the following structure. In the differential amplifier circuit 21, a P-channel MOS transistor 26 whose gate is supplied with a control signal $\phi D$ is connected between a node of power supply voltage VCC and a node 25, a P-channel MOS transistor 28 is connected between the node 25 and a data output node 27, and a P-channel MOS transistor 30 is connected between the node 25 and a node 29. Both the gates of the MOS transistors 28 and 30 are connected to each other and to the node 29. Further, an N-channel MOS transistor 31 whose gate is connected to the data input/output line $\overline{IO}$ is connected between the data output node 27 and the node of ground voltage VSS, and an N-channel MOS transistor 32 whose gate is connected to the data input/output line IO is connected between the node 29 and the node of ground voltage VSS.

Data is output from the data output node 27 of the differential amplifier circuit 21 to a switch circuit 33. The switch circuit 33 includes two P-channel MOS transistors 35 and 36 connected in series between a node of power supply voltage VCC and an output node 34, and two N-channel MOS transistors 37 and 38 connected in series between the output node 34 and a node of ground voltage VSS. Both the gates of the MOS transistors 35 and 38 are connected in common to the data output node 27 of the differential amplifier circuit 21, and both the gates of the MOS transistors 36 and 37 are supplied with control signals $\overline{\phi E}$ and $\phi E$, respectively.

The output node 34 is connected to an input terminal of an inverter 41, and an output terminal of the inverter 41 is connected to an input terminal of an inverter 42. An output terminal of the inverter 42 is connected to the output node 34.

The output node 34 of the switch circuit 33 is connected to a signature circuit 43. The signature circuit 43 generates data proper to the semiconductor memory device of this embodiment, for example, maker codes and device codes of makers and includes four P-channel MOS transistors 44 to 47 and four N-channel MOS transistors 48 to 51. The P-channel MOS transistors 44 and 45 are connected in series between the node of power supply voltage VCC and the node 34, and the N-channel MOS transistors 48 and 49 are connected in series between the node 34 and the node of ground voltage VSS. Similarly, the P-channel MOS transistors 46 and 47 are connected in series between the node of power supply voltage VCC and the node 34, and the N-channel MOS transistors 50 and 51 are connected in series between the node 34 and the node of ground voltage VSS. The gates of the MOS transistors 44, 49, 46, and 51 are supplied with control signals $\overline{\phi F1}$, $\phi F1$, $\overline{\phi F2}$, $\phi F2$, respectively. Both the gates of the MOS transistors 45 and 48 are supplied with a signal F1, and both the gates of the MOS transistors 47 and 50 are supplied with a signal F2.

Figure 3:
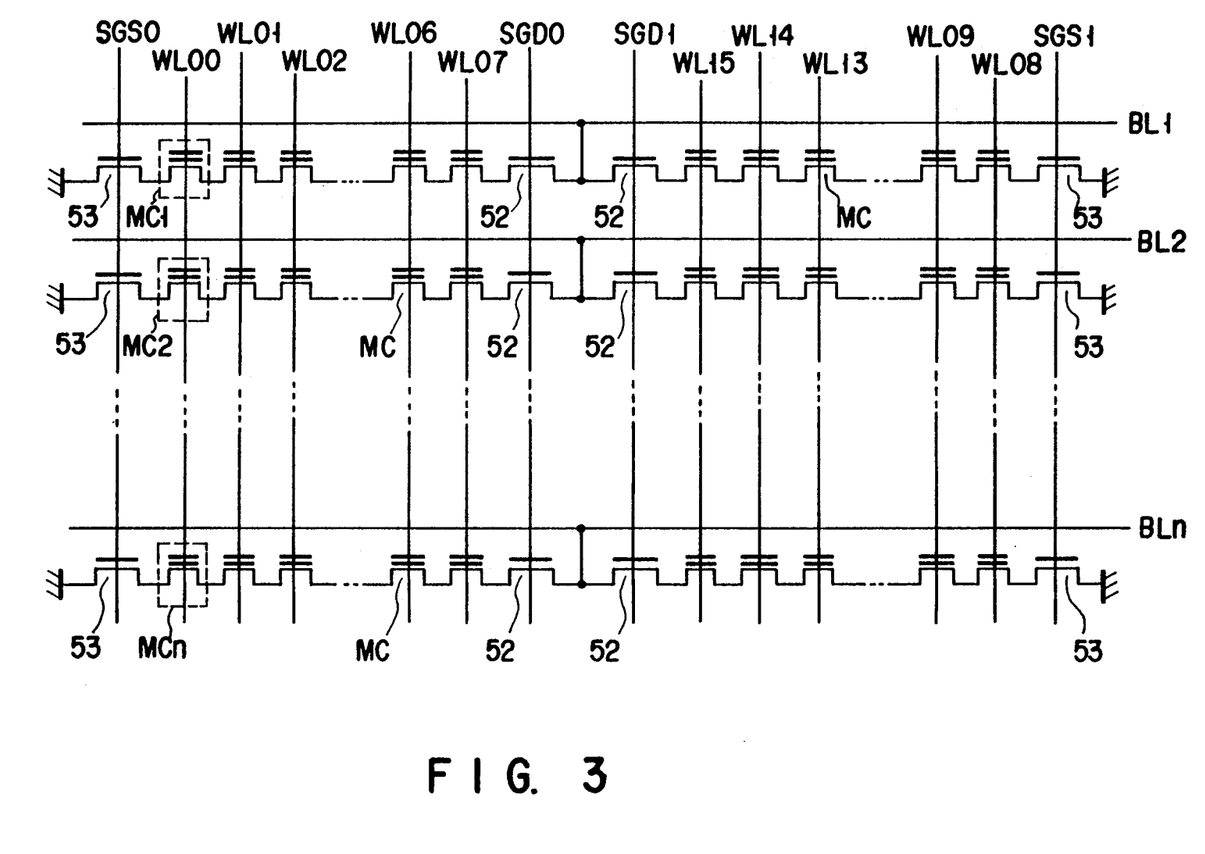
FIG. 3 is a circuit diagram minutely showing a constitution of a circuit of the semiconductor integrated circuit.

FIG. 3 is a circuit diagram minutely showing an arrangement of the memory cell circuit 15 shown in FIG. 1. As shown in FIG. 3, the memory cell circuit 15 connected to the bit line BL1 comprises sixteen memory cells MC each having a nonvolatile transistor of a dual gate structure. These sixteen memory cells MC are separated into two groups each having eight memory cells MC. The eight memory cells MC are connected in series to each other to form a series circuit. One end of the series circuit is connected to the bit line BL1 through a selecting MOS transistor 52, and the other end thereof is connected to the node of the ground voltage VSS through a selecting MOS transistor 53. The memory cell circuits 15 connected to the other bit lines have the same arrangement as that of the memory cell circuit connected to the bit line BL1. The gate of the MOS transistor 52 of each of the memory cell circuits 15 is connected to a selection line SGD0 or SGD1, the gate of the MOS transistor 53 is also connected to the selection line SGS0 or SGS1, and the control gates of the eight memory cells MC of the two groups are connected to eight word lines WL00 to WL07, and WL08 to WL15, respectively.

Figure 5:
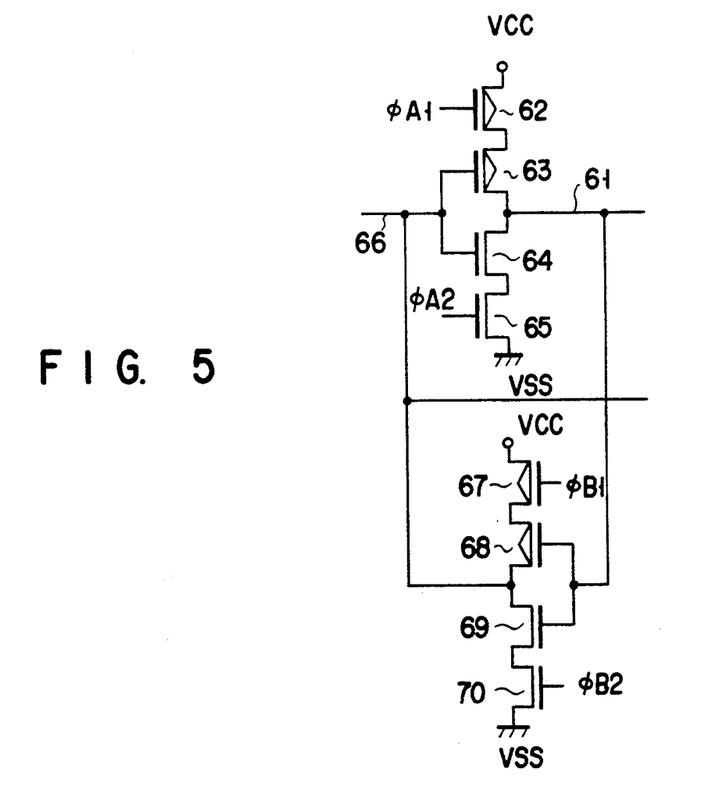
FIG. 5 is a circuit diagram minutely showing a constitution of a circuit of the semiconductor integrated circuit.

FIG. 5 is a circuit diagram minutely showing a constitution of the sense amplifier 17. The sense amplifier 17 has the following constitution. Two P-channel MOS transistors 62 and 63 are connected in series between the node of power supply voltage VCC and a node 61, and two N-channel MOS transistors 64 and 65 are connected in series between the node 61 and the node of ground voltage VSS. The gate of the MOS transistor 62 is supplied with a control signal $\phi A1$, and the gate of the MOS transistor 65 is supplied with a control signal $\phi A2$. The gates of the MOS transistors 63 and 64 are connected in common to a node 66. Two P-channel MOS transistors 67 and 68 are connected in series between the node of power supply voltage VCC and the node 66, and two N-channel MOS transistors 69 and 70 are connected in series between the node 66 and the node of ground voltage VSS. The gate of the MOS transistor 67 is supplied with a control signal B1, and the gate of the MOS transistor 70 is supplied with a control signal $\phi B2$. The gates of the MOS transistors 68 and 69 are connected in common to the node 61. The node 66 is connected to the MOS transistor 16 shown in FIG. 1, and the nodes 61 and 66 are connected to the MOS transistors 18 and 19 shown in FIG. 1, respectively.

Figure 6:
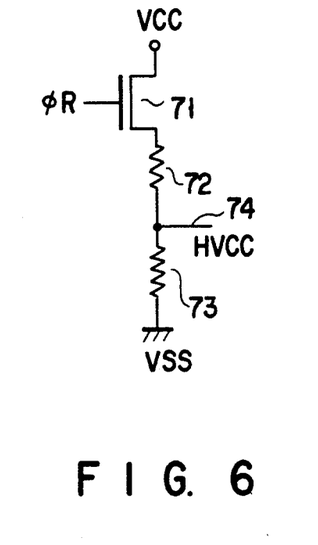
FIG. 6 is a circuit diagram minutely showing a constitution of a circuit of the semiconductor integrated circuit.

FIG. 6 is a circuit diagram showing a precharge voltage generation circuit for generating the precharge voltage HVCC used in the precharge circuit 20 shown in FIG. 2. The precharge voltage generation circuit includes an N-channel MOS transistor 71 one end of which is connected to the node of power supply voltage VCC and whose gate is supplied with a control signal $\phi R$, and twenty-two voltage dividing resistors 72 and 73 having the same resistance value and connected in series between the other end of the MOS transistor 71 and the node of ground voltage VSS. The threshold voltage VTH of the MOS transistor 71 is equal to that of each of the column selection MOS transistors 18 and 19 shown in FIG. 1. In the precharge voltage generation circuit, the control signal $\phi R$ becomes high in level (VCC) in a data read mode and, when the MOS transistor 71 is turned on, a voltage obtained by subtracting the threshold voltage VTH of the MOS transistor 71 from the power supply voltage VCC is divided into two voltages (HVCC) by the resistors 72 and 73, and these voltages are output from a series connection node 74 of the resistors 72 and 73. In other words, the precharge voltage HVCC is calculated from (VCC−VTH)/2, and the threshold voltage VTH of the MOS transistor 71 corresponds to that of each of the column selection N-channel MOS transistors 18 and 19.

Figure 8:
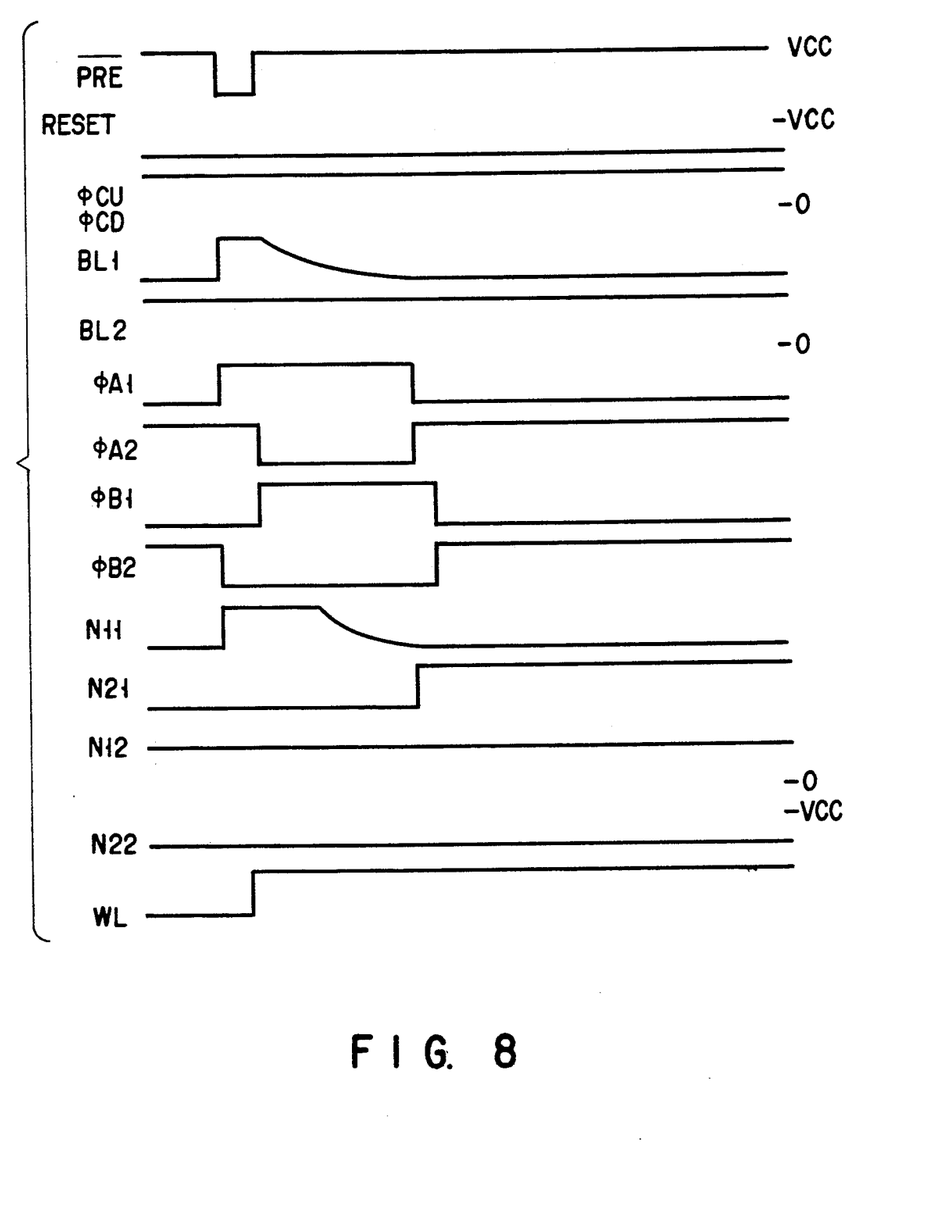
FIG. 8 is a timing chart of an operation of the semiconductor integrated circuit.
Figure 9:
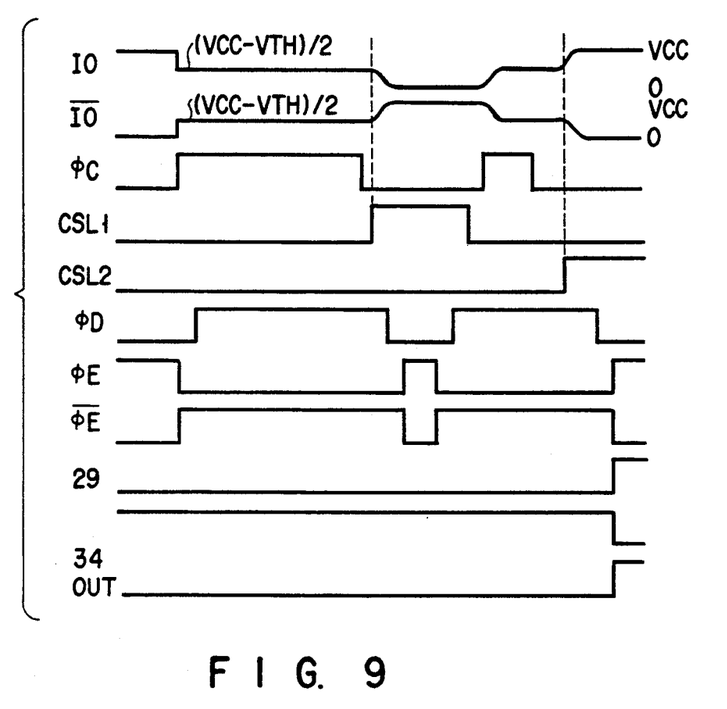
FIG. 9 is a timing chart of an operation of the semiconductor integrated circuit.

In the semiconductor memory device having the above constitution, a random read mode starts when an externally input row address changes. An operation of the semiconductor memory device in this random read mode will be described, using the timing charts shown in FIGS. 8 and 9. In FIGS. 8 and 9, the nodes 66 and 61 of the sense amplifier 17 connected to the bit line BL1 are denoted by N11 and N21, and the nodes 66 and 61 of the sense amplifier 17 connected to the bit line BL2 are denoted by N12 and N22.

A precharge control signal $\overline{PRE}$ becomes low in level, and becomes high in level after a lapse of predetermined time. A reset signal RESET then remains low in level. When the precharge control signal $\overline{PRE}$ is low, the MOS transistor 13 is turned on, and the node 12 becomes high. Since the control signal $\phi CU$ then remains high, the MOS transistor 11 is turned on. Therefore, the bit lines BL1 to BLn are precharged at the power supply voltage VCC while the precharge control signal $\overline{PRE}$ is low in level.

Since the level of the control signal $\phi A2$ is high and that of the control signal $\phi BL1$ is low in the sense amplifier when the bit lines BL1 to BLn are precharged at the power supply voltage VCC, the MOS transistors 64 and 65 are turned on to make the node 61 low in level, and the MOS transistors 67 and 68 are turned on to make the node 66 high in level. Then the control signal $\phi A2$ becomes low, the control signal $\phi B1$ becomes high, and the MOS transistors 65 and 67 of the sense amplifier 17 are turned off. The bit lines BL1 to BLn and the node 66 go into a floating state while remaining at a precharge level of VCC, and the node 61 also goes into the floating state while remaining at the level of VSS.

Figure 4:
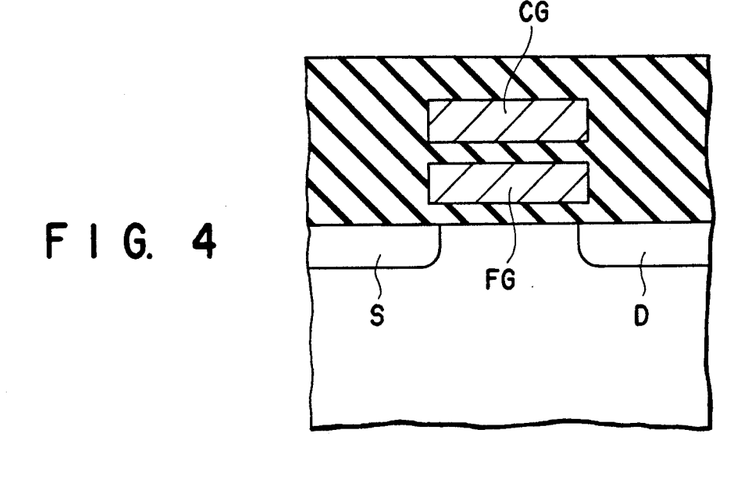
FIG. 4 is a cross-sectional view of a memory cell of the semiconductor integrated circuit.

In the memory cell circuits 15 shown in FIG. 3, the word lines and the selection lines SGD0 and SGD1 corresponding to an input row address, are selectively driven, and one memory cell is thus selected for each of the memory cell circuits 15. The memory cell has the dual gate structure as shown in FIG. 4. When data "0" is programmed in the memory cell, electrons are stored in a floating gate, and the threshold voltage of the memory cell is positive. When data "1" is programmed in the memory cell, the electrons are swept away from the floating gate, and the threshold voltage of the memory cell is negative.

When in the memory cell circuits 15, memory cells MC1 and MC2 connected to the bit lines BL1 and BL2 are selected, and data "1" is written to the memory cell MC1, and data "0" is written to the memory cell MC2, if the potential of the word line increases, the bit line BL1 is discharged by the memory cell and its potential decreases near to a level of the ground voltage VSS. The bit line BL2 remains at a level of the power supply voltage VCC. Therefore, the potential of each of the bit lines is rendered high or low by reading data from the corresponding memory cell.

When the control signals $\phi A1$, $\phi A2$, $\phi B1$, and $\phi B2$ become low, high, low, and high, respectively, and the sense amplifiers 17 are activated, the node 66 (node N11) and node 61 (node N21) of the sense amplifier 17 connected to the bit line BL1 becomes low and high, respectively, and the node 66 (node N12) and node 61 (node N22) of the sense amplifier 17 connected to the bit line BL2 become high and low, respectively. All the column selection lines CSL1 to CSLn are low in level. Thus data of n memory cells is latched by n sense amplifiers 17.

The level of the control signal $\phi C$ is high, and the MOS transistors 22, 23 and 24 of the precharge circuit 20 shown in FIG. 2 are all turned on. Since the level of the control signal $\phi C$ is high in the random read mode, and the precharge voltage HVCC is generated in the precharge voltage generation circuit shown in FIG. 6, the data input/output lines IO and $\overline{IO}$ are precharged by the precharge voltage HVCC.

Assuming that the power supply voltage VCC is 5 V and the threshold voltage of the N-channel MOS transistor 71 shown in FIG. 6 is 1.6 V, the precharge voltage HVCC is 1.7 V=(5 V−1.6 V)/2. Both the data input/output lines IO and $\overline{IO}$ are therefore precharged at 1.7 V.

The level of the column selection line CSL1 becomes high in response to a column address, and the sense amplifier 17 connected to the bit line BL1 is connected to the data input/output lines IO and $\overline{IO}$ via the MOS transistors 18 and 19. The data input/output line $\overline{IO}$ is charged with the potential of the node 61 of the sense amplifier 17, and the data input/output line IO is discharged by the potential of the node 66. Therefore, the level of the data input/output line $\overline{IO}$ comes near to (VCC−VTH), and the input/output line IO comes near to VSS. VTH represents the threshold voltage of the N-channel MOS transistor 18.

After the data input/output lines IO and $\overline{IO}$ starts to charge or discharge, the control signal $\phi D$ becomes low in level and the differential amplifier circuit 21 is activated. The output node 27 of the differential amplifier circuit 21 thus becomes low in level. In the switch circuit 33, the level of the control signal $\overline{\phi E}$ is low and that of the control signal $\phi E$ is high in the switch circuit 33, both the MOS transistors 35 and 36 are turned on, and the output node 34 becomes high in level. Consequently, high-level data is supplied to a buffer circuit as readout data OUT supplied from the memory cell connected to the bit line BL1.

Only the column address is changed, the column selection line CSLl is rendered an unselected state by a new column address and its level becomes low. The control signals $\phi E$, $\overline{\phi E}$, $\phi D$, and $\phi C$ become low, high, high, and high, respectively, and the MOS transistor 22 of the precharge circuit 20 is turned on. The data input/output line IO and $\overline{IO}$ are thus equalized. More specifically, though one of the potentials of the data input/output lines IO and $\overline{IO}$ was 0 V of the ground voltage VSS and the other potential was 3.4 V of (VCC−VTH) both the potentials becomes about 1.7 V (=3.4 V±) by the above equalizing operation since the capacities of the data input/output lines IO and $\overline{IO}$ are virtually equal to each other. Therefore, the potentials of the data input- /output lines become the same as the precharge voltage HVCC only by the equalizing operation, and no new precharge voltage HVCC has to be generated from the circuit shown in FIG. 6. It is thus possible to decrease in current consumption.

The amount of charge QIO necessary for charging the data input/output lines IO and $\overline{IO}$ by a single readout operation is given by the following equation if the capacity of each of the data input/output lines is CIO, and the potential amplitude thereof is VIO.

$$\begin{aligned} QIO &= CIO \times VIO \\ &= CIO \times \{(VCC - VTH) - (VCC - VTH) \pm 2 \\ &= CIO \times \{(VCC - VTH) \pm 2\} \end{aligned} \quad (1)$$

If the precharge voltage of the data input/output line is set to the power supply voltage VCC as in the conventional case, the amount of charge QIO is CIO×VCC, which is twice or more as large as that of the above embodiment of the present invention. Since the current consumption for charging/discharging the data input/output lines IO and $\overline{IO}$ is low, noise generated on the power supply can be reduced.

The new column selection line CSL2 is then rendered an unselected state and its level becomes high. The levels of the nodes 27 and 34 are set in accordance with readout data OUT of the memory cell circuit 15 connected to the bit line BL2, and the readout data OUT is supplied to the buffer circuit.

Figure 10:
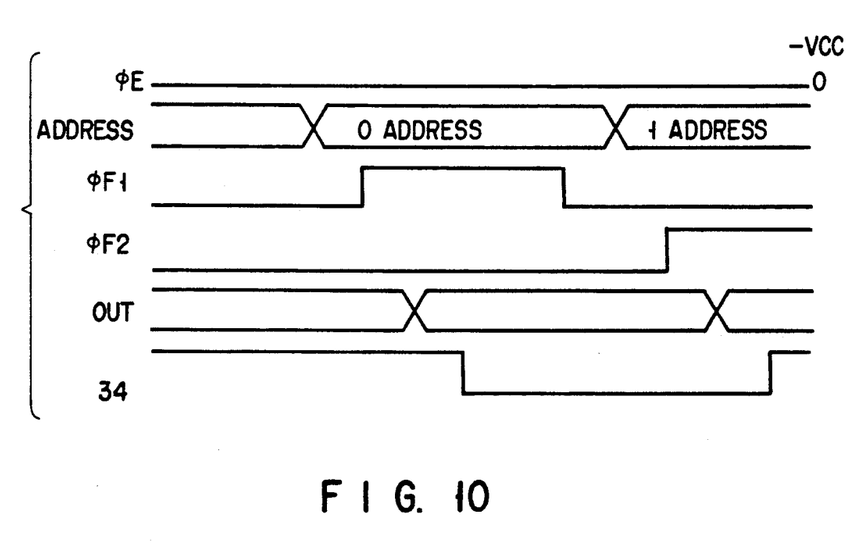
FIG. 10 is a timing chart of an operation of the semiconductor integrated circuit.

An operation of the semiconductor memory device in a signature mode will be described, using the timing charts shown in FIG. 10. In the signature mode, the control signals $\phi F1$ and $\phi F2$ selectively become high in level and the control signals $\overline{\phi F1}$ and $\overline{\phi F2}$ selectively become low in level, in response to an input address. For example, when a maker code is read out, an address corresponding to "0" is input. If such an address is input, the control signal $\phi F1$ becomes high in level and the control signal $\overline{\phi F1}$ becomes low in level. If the maker code is "0" the gates of the MOS transistors 45 and 48 are connected to the node of the power supply voltage VCC by a mask so that the control signal F1 is set in advance to the power supply voltage Vcc. In the signature circuit 43, both the MOS transistors 48 and 49 are turned on, the level of the node 34 is low and that of the readout data OUT is also low.

When a device code is read out, an address corresponding to "1" is input. If such an address is input, the level of the control signal $\phi F2$ is high and that of the control signal $\overline{\phi F2}$ is low. If the device code is "1," the gates of the MOS transistors 47 and 50 are connected to the node of the ground voltage VSS by the mask so that the control signal F2 is set to the ground voltage VSS. In the signature circuit 43, both the MOS transistors 46 and 47 are turned on, and the level of the node 34 is high and that of the readout data OUT is also high.

The signature circuit 43 is provided for each of the data input/output lines, and the total number of signature circuits is n. For example, in a memory having eight input/output lines, eight signature circuits are arranged. The control signals F1 and F2 of each of the signature circuits are fixed to the node of the power supply voltage VCC or the ground voltage VSS. Therefore, in the signature mode, an 8-bit maker code or device code is read out.

In this signature mode, the readout of the code is started in accordance with a variation in address, and the control signal $\phi$ always remains at a low level, and the MOS transistors 36 and 37 in the switch circuit 33 are always turned off. For this reason, no data is supplied from the memory cell to the output node 34.

If the signature circuit is provided at an output of each of the data input/output lines, the size of a chip can be made smaller than when codes are written to the memory cells, since the memory cells can be arranged in space areas of peripheral circuits. When a memory cell is one unit of a plurality of bits like a NAND type cell as shown in FIG. 3, an increase in the area of a memory cell array due to the signature circuit can be prevented. Furthermore, access time is short since the signature circuit is provided at the output of each data input/output line.

Figure 7:
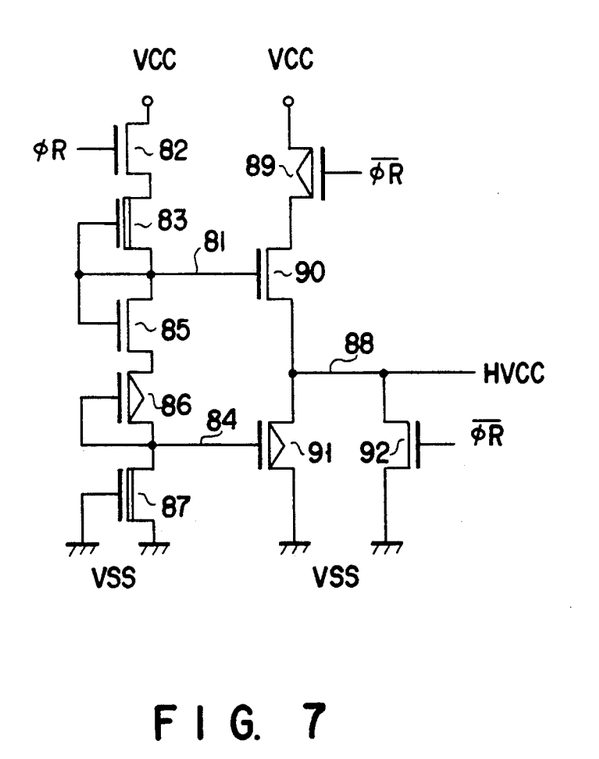
FIG. 7 is a circuit diagram minutely showing a constitution of a circuit of the semiconductor integrated circuit.

Needless to say, the present invention is not limited to the above embodiment, but various changes and modifications can be made. For example, the precharge voltage generation circuit shown in FIG. 6 can be replaced with that shown in FIG. 7. The precharge voltage generation circuit shown in FIG. 7 has the following constitution. An N-channel MOS transistor 82 and an N-channel depletion type MOS transistor 83 having the same threshold voltages of the column selection transistors 18 and 19 shown in FIG. 1 are connected in series between a node of power supply voltage VCC and a node 81. An N channel MOS transistor 85 and a P-channel MOS transistor 86 are connected in series between the node 81 and a node 84. An N-channel depletion type MOS transistor 87 is connected between the node 84 and the node of ground voltage VSS. The gate of the MOS transistor 82 is supplied with a control signal $\phi R$. The gates of the MOS transistors 83 and 85, the gate of the MOS transistor 86, and the gate of the MOS transistor 87 are connected to the node 81, the node 84, and the node of ground voltage VSS, respectively. A P-channel MOS transistor 89 and an N-channel MOS transistor 90 are connected in series between the node of power supply voltage VCC and a node for generating a voltage HVCC. A P-channel MOS transistor 91 and an N-channel MOS transistor 92 are connected in parallel between the node 88 and the node of ground voltage VSS. The gates of the MOS transistors 89 and 92 are supplied with a control signal $\overline{\phi R}$, and the gate of a MOS transistor 91 is connected to the node 84. In the precharge voltage generation circuit shown in FIG. 7, the output voltage HVCC can be set to half of (VCC−VTH).

As described above, in the semiconductor integrated circuit according to the present invention, current consumption can be reduced, noise can be prevented from generating, and access time can be shortened.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor memory device comprising:
   a pair of data input/output lines;
   a memory cell circuit including a plurality of cell transistors;
   a bit line connected to current paths of each of cell transistors of said memory cell circuit;

word lines connected to control gates of each of the cell transistors;

a sense amplifier for detecting a potential at said bit line corresponding to said memory cell circuit and for outputting a pair of complementary data signals;

a pair of column selection MOS transistors connected between said pair of data input/output lines and a pair of output terminals of said sense amplifier;

a precharge circuit for precharging said pair of input/output lines with a predetermined potential prior to readout of the potential at said bit line corresponding to said memory cell circuit; and means for applying to said precharge circuit a precharge potential having a value expressed as $(V_{CC}-V_{th})/2$, where $V_{CC}$ is a power supply voltage, and $V_{th}$ is a threshold voltage of each of said column selection MOS transistors.

2. The semiconductor memory device according to claim 1, wherein said means comprises a MOS transistor, one current path thereof being connected to a power supply, and a series circuit including a first resistor and a second resistor between a current path other than said one current path of said MOS transistor and a ground.

* * * * *